United States Patent [19]

Parker

[11] 4,330,683
[45] May 18, 1982

[54] ENCAPSULATION FOR SEMICONDUCTOR DEVICE

[75] Inventor: Frederick D. Parker, Basking Ridge, N.J.

[73] Assignee: Bell Telephone Laboratories, Incorporated, Murray Hill, N.J.

[21] Appl. No.: 212,564

[22] Filed: Dec. 3, 1980

[51] Int. Cl.³ .............................................. H05K 5/02
[52] U.S. Cl. ................................ 174/52 FP; 357/74
[58] Field of Search ...................... 174/52 FP, 52 PE; 357/74

[56] References Cited

U.S. PATENT DOCUMENTS 3,441,853  4/1969  Bodine ...................... 174/52 FP X
3,950,603  4/1976  Brefka ............................... 174/52 R
4,195,193  3/1980  Grabbe et al. .................. 174/52 FP
4,209,798  6/1980  Beretta .................................. 357/70

Primary Examiner—B. A. Reynolds
Assistant Examiner—D. A. Tone
Attorney, Agent, or Firm—H. W. Lockhart

[57] ABSTRACT

A semiconductor encapsulation of the chip carrier type has a collar-like protective housing member which encompasses the periphery of the chip carrier from which external lead members protrude. The protective housing member has a mating surface with a portion of the surface of the carrier. The interior of the protective housing member has recesses which accommodate the lead members singly, thus precluding their deformation.

2 Claims, 2 Drawing Figures

ENCAPSULATION FOR SEMICONDUCTOR DEVICE

BACKGROUND OF THE INVENTION

This invention relates to semiconductor device encapsulations, and particularly encapsulations of the chip carrier type.

Semiconductor chip carriers have been standardized in several designs, including both leaded and leadless types, and in several standard configurations and dimensions. Generally, the carrier type packages are extremely compact, designed for high-density applications. In particular, they utilize close center-to-center lead spacings, typically in the range of 20 to 100 mils. Of particular interest are chip carriers having external metal leads arranged in parallel relation on the periphery of the molded body of the chip carrier. The external leads typically are arranged on all four sides of a rectilinear, usually square, configuration.

Because of the close spacing of the lead members and the small size of chip carriers, the external lead members are extremely susceptible to deformation and damage during the fabrication and assembly processes which render their attachment to circuit boards and the like, particularly by automatic means, difficult and costly. The standards imposed on chip carrier designs require external lead members having some length and terminating in a distinctive arrangement usually referred to as a "footprint". This footprint matches the contact areas on a circuit board or other type of mounting medium. Deflection or other deformation of the external lead members alters the footprint, rendering assembly into circuit apparatus difficult, if not impossible. Correction of such deformation is difficult because of the small size of the external leads and their close proximity to the body of the chip carrier.

Accordingly, an object of this invention is an arrangement which precludes deformation of the external leads on a chip carrier once they have been shaped and formed. An ancillary object is an arrangement which does not substantially increase the size of the chip carrier while providing protection for the formed external leads.

SUMMARY OF THE INVENTION

The invention in one aspect comprises a collar-like protective housing member which encompasses the periphery of the chip carrier from which the external lead members protrude. The protective housing member, typically a molded plastic element, has a mating surface which makes contact with a portion of the surface of the chip carrier. The interior surface of the protective housing member, juxtaposed to the peripheral face of the chip carrier, contains an array of recesses each of which accommodates an external lead member. The protective housing member may be fixed to the chip carrier either by means of a locking member injection or transfer molded to both the chip carrier and the protective housing member after assembly. Alternatively, the protective housing member may be attached to the chip carrier by an adhesive epoxy preform or may be temporarily clamped in place during the latter portions of the fabrication process and assembly operations. In the latter case, the protective housing member may be removed subsequent to assembly operations.

Thus, a feature of the molded plastic protective housing member which fits over and around a chip carrier and precludes the impingement of tools or other circuit elements against the external lead members of the chip carrier which otherwise produce damage and render assembly difficult or impossible.

A further feature is a combination of a protective housing member and a chip carrier in which the ends of the external lead members are bent outward and in which the overall dimensions of the combination do not substantially exceed those of a standard unprotected chip carrier having the ends of the external lead members bent inward.

BRIEF DESCRIPTION OF THE DRAWING

The invention and its other objects and features will be better understood from the following detailed description taken in conjunction with the drawing in which.

DETAILED DESCRIPTION

Figure 1:
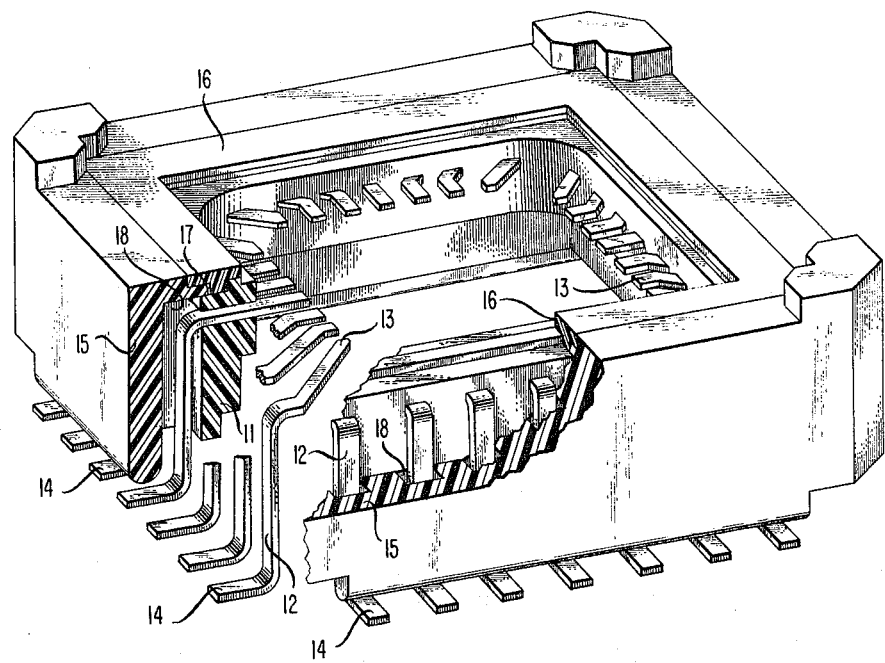
FIG. 1 is a perspective view, partially cut away and sectioned, of an uncompleted semiconductor chip carrier and a protective housing member assembled thereto in accordance with one embodiment of this invention.

FIG. 1 shows the molded body 11 of a semiconductor chip carrier having an array of lead members 12 molded therein. In this particular embodiment, seven lead members are provided on each side making a total of 28. The chip carrier is shown without the interiorly mounted semiconductor chip, the electrodes of which are attached by various means such as wire bonding to the internal ends 13 of the lead members 12. The lead members 12 have external ends 14, which constitute the external contacts for the chip carrier and in the aggregate array, comprise the so-called footprint of the device encapsulation.

In a typical fabrication process, the lead members 12 are produced from a flat tape or foil in a manner well known in the art. Various procedures may be followed for forming the tape, assembling the semiconductor chip thereto, and molding the carrier body 11 to the tape. Of significance to this invention is the procedure which trims and shapes external lead members 12. This is a comparatively precise process which maintains the relatively close and uniform spacing between these parallel disposed lead members 12 around the periphery of the body 11. Typically standard carrier designs utilize an external lead configuration in which the ends of feet 14 are bent inwardly to produce the standard footprint for the particular size and number of leads.

In the specific embodiment shown in FIG. 1, a collar-like protective housing member 15 encompasses the periphery of the chip carrier 11 and the protruding external lead members 12. The protective housing member 15 has a mating surface 17 which contacts a portion of the surface of the carrier body 11. The internal face of the housing member 15 has an array of recesses 18 each of which accommodates an external lead member 12. Thus, the lead members 12 are protected from external impingements and generally are prevented from deflection or deformation which can distort the footprint of the chip carrier.

The protective housing member 15, in this specific embodiment, is fixed to the chip carrier body 11 by the locking member 16, which is an injection or transfer molded strip having a T-shaped cross-section. The formation of locking member 16 is an injection or transfer mold using the same molding material, from which the chip carrier body 11 and protective housing member 15 are formed, is a straightforward and simple process. Of particular note is the fact that because the external ends 14 of the leads are bent outwardly to produce the standard footprint and are protected by the housing member 15 which projects beyond the chip carrier body a distance approximately equal to the footprint width, the overall size of the assembly is no greater than the standard chip carrier which has a larger body and in which the footprint is achieved by bending the external ends inward. Alternatively, the ends of the external lead members may be unbent for insertion into sockets.

Figure 2:
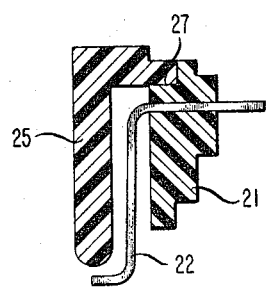
FIG. 2 is a detail in cross-section showing an alternative arrangement for attaching the protective housing member to the chip carrier.

Alternative arrangements may be used to attach the protective housing member to the chip carrier. Referring to FIG. 2, the protective housing member 25 is directly attached to the carrier body 21 at the mating surface 27. A lead member 22 is shown molded through the carrier body 21. Typically, a preform of epoxy adhesive in the shape of a gasket is laid on the carrier body surface 27 before the assembly is made. Thereafter a brief curing in an oven is sufficient to produce an epoxy bond between the housing member 25 and the carrier body 21.

A further alternative is to temporarily clamp the protective housing member 15 to the carrier body 11 until the chip carrier has been bonded as by soldering or other means to a circuit board, after which the protective housing member, having fulfilled its function of preventing deflection or deformation of the external lead members 12 during assembly, may be removed, providing greater clearance around apparatus elements for the purpose of enhancing cooling or for other structural reasons.

Although the invention has been described in terms of its application to a semiconductor chip carrier, the concept of a collar-like protective housing member fitting around an electronic device encapsulation having small close-spaced external leads which are susceptible to deflection and deformation is one which can be applied to other electronic encapsulations.

What is claimed is:

1. A semiconductor encapsulation of the chip carrier type having an array of close-spaced external metal lead members disposed in parallel relation around the periphery thereof, characterized in that a collar-like protective housing member encompasses the periphery of the carrier and the external lead members, and has a mating surface which contacts a portion of the surface of the carrier, said mating surface comprising an inwardly projecting flange, the interior periphery of said flange defining with a portion of the surface of the carrier an annular slot, and which has a T-section key member bonded in said slot.

2. A semiconductor encapsulation of the chip carrier type having an array of close-spaced external metal lead members disposed in parallel relation around the periphery thereof, characterized in that a collar-like protective housing member encompasses the periphery of the carrier and the external lead members, and has a mating surface which contacts a portion of the surface of the carrier, the interior surface of the protective housing member having an array of recesses each of which accommodates an external lead member of the carrier, the lead members being free of any physical contact with the surfaces of said recesses or said carrier.

* * * * *